United States Patent [19]

Boulitrop et al.

[11] Patent Number: 4,736,234

[45] Date of Patent: Apr. 5, 1988

[54] METHOD OF FABRICATION OF A LIGHT IMAGE DETECTOR AND A TWO-DIMENSIONAL MATRIX DETECTOR OBTAINED BY MEANS OF SAID METHOD

[75] Inventors: François Boulitrop, Sceaux; Eric Chartier, Chatenay Malabry; Nicolas Szydlo, Ris Orangis; Bernard Hepp, Neuilly sur Seine; Nicole Proust, Palaiseau, all of France

[73] Assignee: Thomson-CSF, Paris, France

[21] Appl. No.: 886,159

[22] Filed: Jul. 16, 1986

[30] Foreign Application Priority Data

Jul. 19, 1985 [FR] France .................. 85 11104

[51] Int. Cl.[4] .............. H01L 27/14; H01L 31/00; H01L 21/306; B44C 1/22
[52] U.S. Cl. .................. 357/30; 156/653; 156/656; 156/657; 156/662; 250/211 R; 357/2; 357/49; 357/58; 358/212; 437/3
[58] Field of Search ............. 29/569 L, 572, 580, 29/576 W; 437/3; 156/643, 646, 650, 652, 653, 655, 656, 657–659.1, 661.1, 662; 357/2, 19, 29, 30, 17, 49, 50, 58, 72, 76; 136/249, 257, 258; 358/212, 213, 285, 293, 294; 250/211 R, 213 R, 578, 211 J

[56] References Cited

U.S. PATENT DOCUMENTS 4,453,184 6/1984 Hanakawa et al. .............. 358/213

FOREIGN PATENT DOCUMENTS 0032847 7/1981 France .

OTHER PUBLICATIONS

IEEE Electron Device Letters, vol. EDL-4, No. 10, Oct. 1983, pp. 375–376, IEEE, New York, U.S.; S. Miura et al.: "A Monolithically Integrated AlGaAs/GaAs p-i-n/FET Photoreceiver by MOCVD".
Extended Abstracts of the 15th Conference on Solid State Devices and Material, Tokyo, 1983, pp. 201–204, Tokyo, JP; F. Okumura, et al.: "Amorphous Si:H Linear Image Sensor Operated by a-Si:H TFT Array", pp. 202–203: paragraph 3; FIG. 4.
Extended Abstracts of the 26th International Conference of Solid State Devices and Material, Tokyo, 1984, pp. 325–328, Tokyo, JP; S. Uya et al.: "A High Resolution CCD Image Sensor Overlaid With an a-SI:H Photoconductive Layer", pp. 326,327: paragraph 3; FIGS. 1,3.

Primary Examiner—William A. Powell
Attorney, Agent, or Firm—Oblon, Fisher, Spivak, McClelland & Maier

[57] ABSTRACT

In a light image detector, a substrate is covered with a first layer of conductive material on which is formed a two-dimensional matrix array of photodiodes in the form of pads arranged in rows and columns and each comprising a layer of amorphous semiconductor material doped with a predetermined type (n-type or p-type), a layer of undoped amorphous semiconductor material, a layer of amorphous semiconductor material doped with another predetermined type (n-type or p-type), a second layer of conductive material, each photodiode being insulated from adjacent photodiodes by means of insulating material. On the insulating material, columns of material are disposed along the columns of photodiodes and are each formed by a layer of metallic material and a layer of doped amorphous semiconductor material. Connection elements are each connected to a photodiode through the layer of conductive material of the photodiode, are located in proximity to a column and each formed by a layer of metallic material and a layer of doped amorphous semiconductor material. Rows of material are disposed along the lines of photodiodes and overlap the columns as well as at least one connection element at each point of intersection of a row and a column. Each row is formed by a layer of undoped amorphous semiconductor material, an insulating layer and a layer of metallic material.

22 Claims, 5 Drawing Sheets

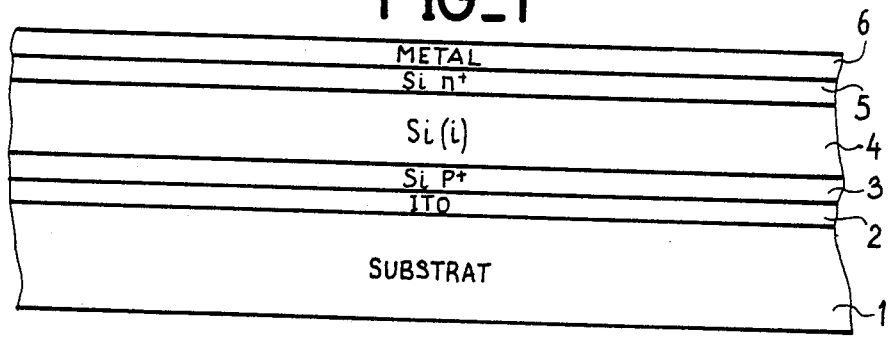
FIG_1
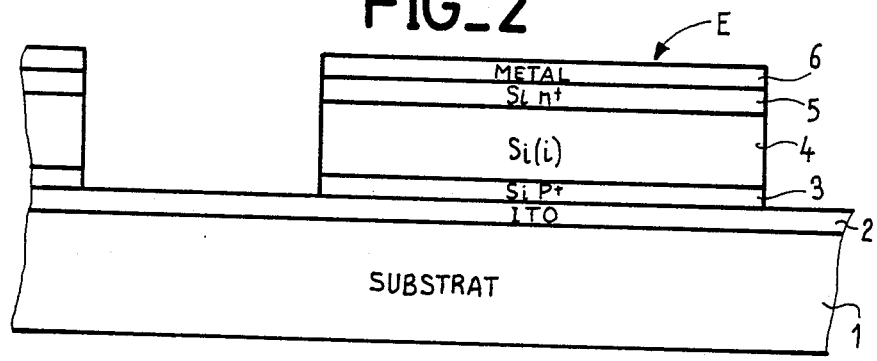
FIG_2
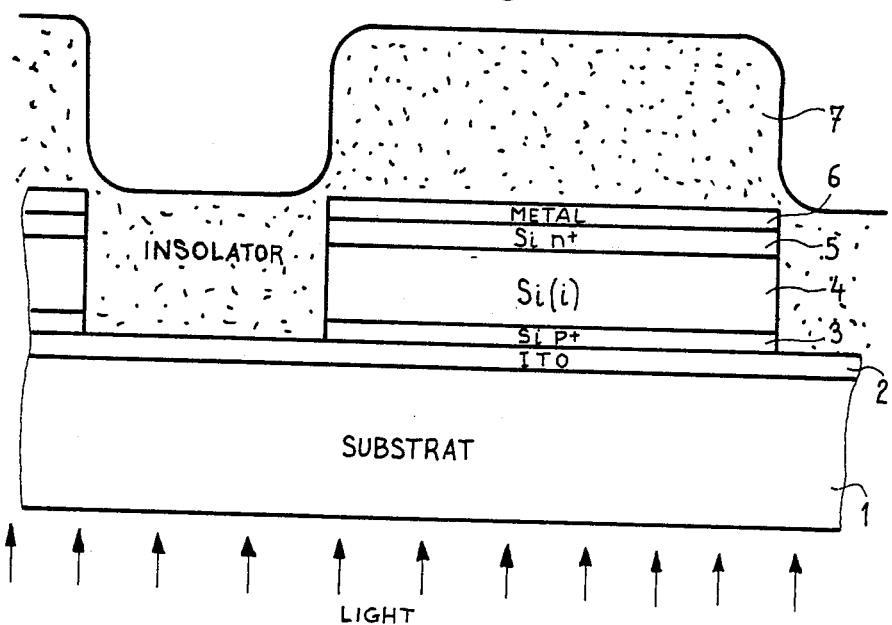
FIG_3

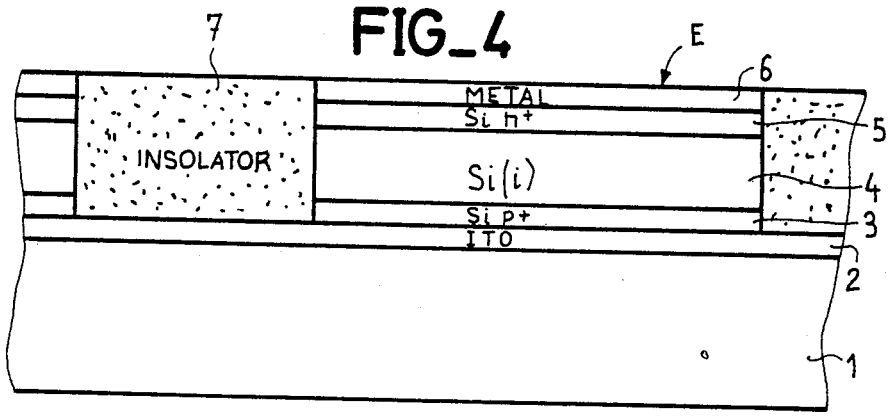
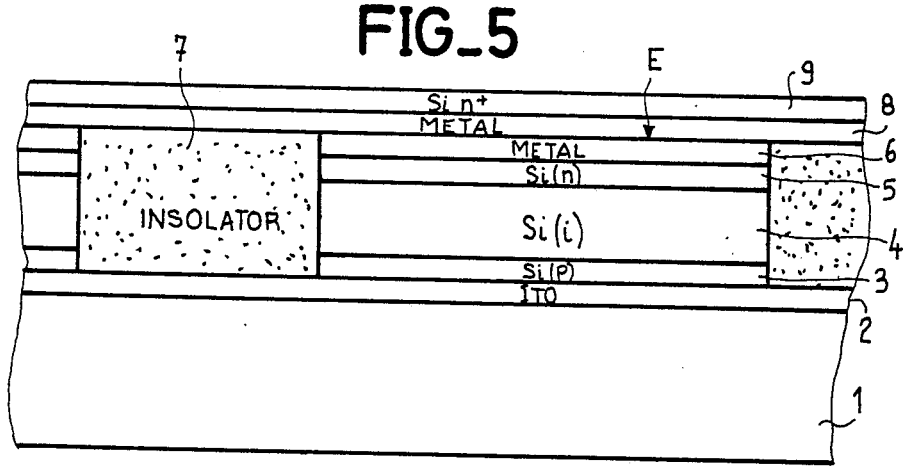
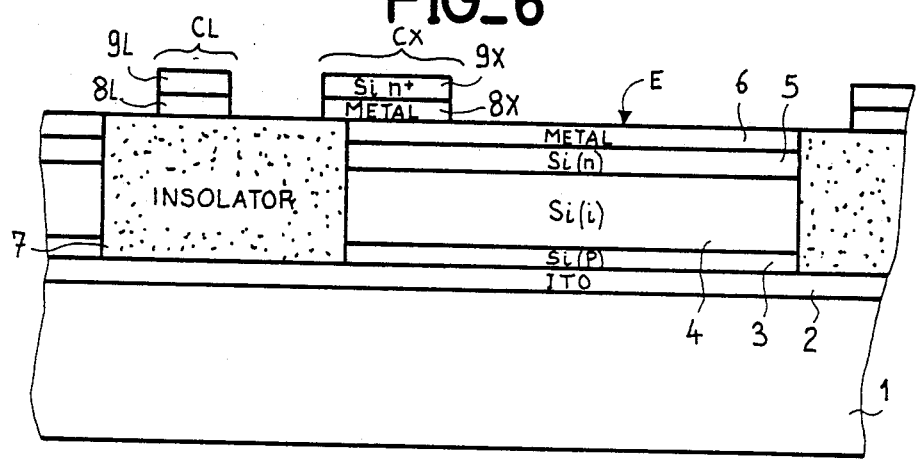

FIG_7
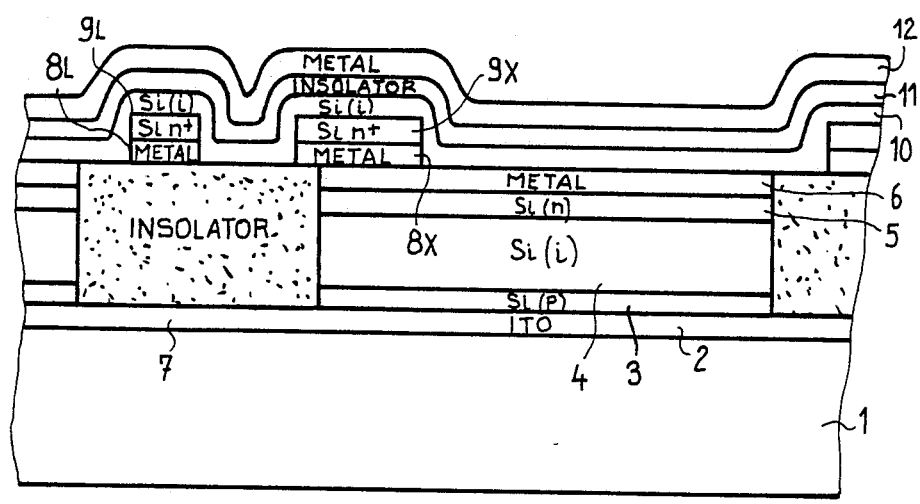
FIG_8
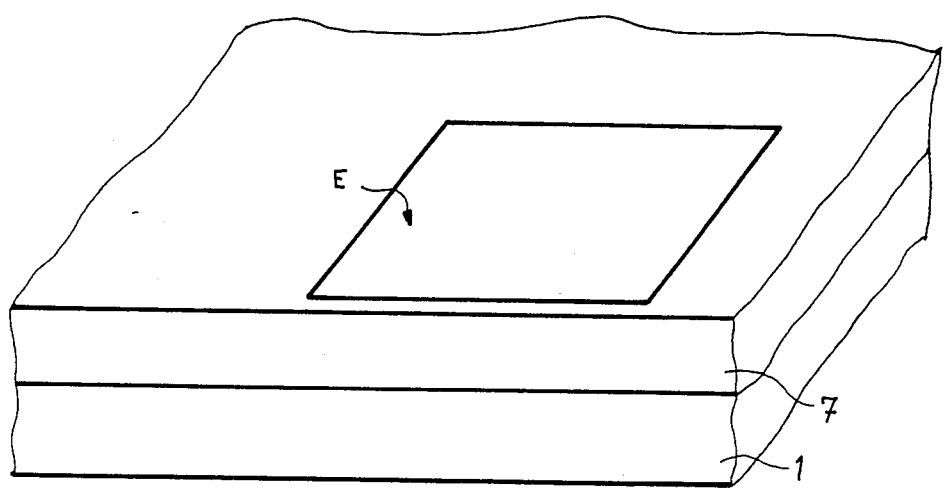

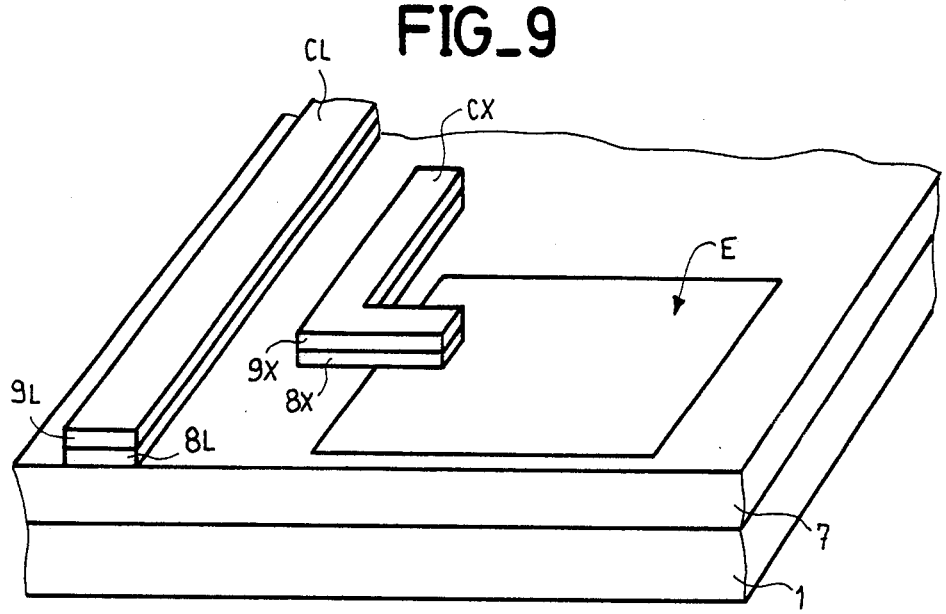
FIG_9
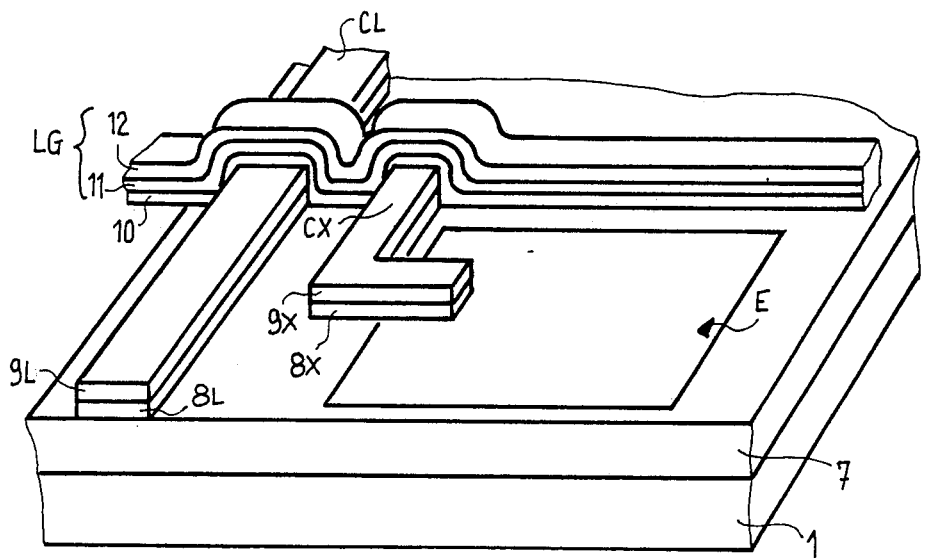
FIG_10

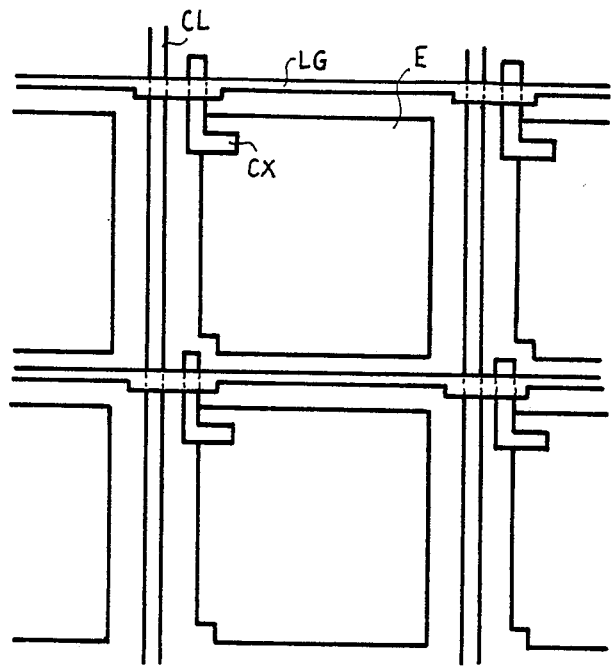
FIG_12
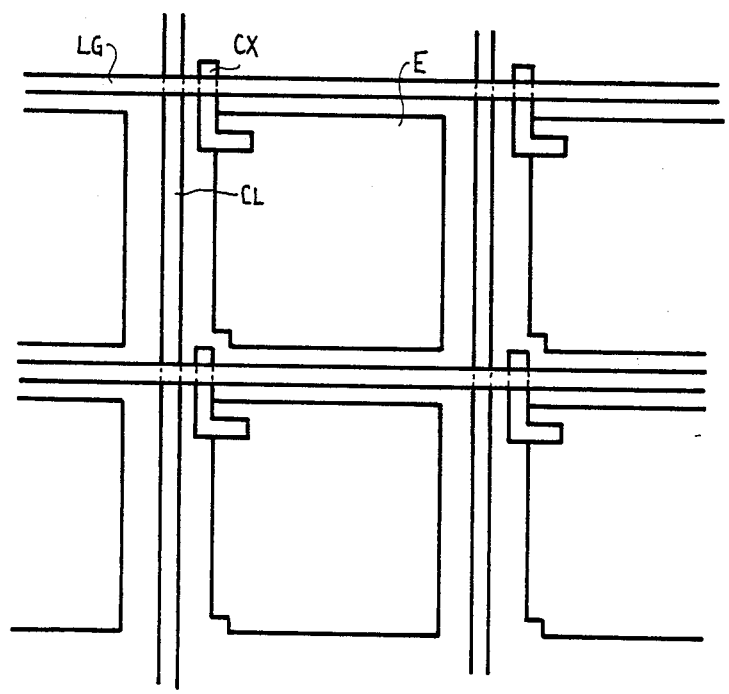
FIG_11

METHOD OF FABRICATION OF A LIGHT IMAGE DETECTOR AND A TWO-DIMENSIONAL MATRIX DETECTOR OBTAINED BY MEANS OF SAID METHOD

BACKGROUND OF THE INVENTION

1. Field of the Invention

This invention relates to a method of fabrication of a light image detector and to a two-dimensional matrix detector which is obtained by means of said method in the general field of fabrication of electronic circuits in thin films on large surfaces.

The application contemplated in the present invention is the integrated control of each elemental point of a two-dimensional matrix image detector.

2. Description of the Prior Art

At the present time, the principal applications in which the high photoconductivity of amorphous silicon is associated with the possibility of fabricating electronic control circuitry from the same material and on the same substrate are concerned with linear image detectors of large size (up to 20 cm) which are necessary for reading documents corresponding to the international page format A4 by lateral displacement of the document with respect to the sensor.

Three different structures have been contemplated for the construction of linear detectors of this type:
the association of a photoconductor, of a storage capacitor, and of a thin-film transistor (TFT) of amorphous silicon (a-Si) as described in the article by M. Matsumura in the review entitled "IEEE Electron Device Letters", vol. EDL - 1, No. 9, September 1980, pages 182 to 184;
the association of a photodiode of amorphous silicon and of a TFT of amorphous or polycrystalline silicon as described in "Extended Abstracts of the 15th Conference on Solid State Devices and Materials", Tokyo (1983), pages 201 to 204, by F. Okumura;
the association of a photodiode and of a blocking diode of a-Si as described by Y. Yamamoto in "Extended Abstracts of the 15th Conference on Solid State Devices and Materials", Tokyo (1983), pages 205 to 208.

A certain number of these structures make it possible to obtain devices having the following characteristics:
Length: 50 mm
Resolution: 8 to 10 bits/mm
Size of pixel: 100 ?m × 70 ?m
Reading time: 2 ?s/bit without multiplexing.

On the basis of these results, it would appear reasonable to expect the forthcoming construction of linear sensors which permit reproduction of documents under good conditions. By way of example, it will be feasible to reproduce documents having a width of 216 mm at a rate of 8 bits per millimeter and at a paper transfer rate of 5 ms per line.

A two-dimensional image detector having a matrix addressing and reading system has also been developed such as the detector described in the article by S. Uya in Extended Abstracts of the 16th Conference on Solid State Devices and Materials, Kobe, (1984), pages 325 to 328. The image detector described in this article is formed of a matrix of photodiodes of amorphous silicon superposed on a two-dimensional array of charge-coupled devices (CCDs) for reading the charges created by light. Since the CCD is formed of monocrystalline silicon, the size of the sensor is limited by requirements which are specific to the monocrystalline silicon technology, namely a prototype of less than 1 cm on each side.

In contrast, the present invention relates to a large-sized two-dimensional image detector with matrix addressing and reading.

The elemental point is constituted by an amorphous silicon photodiode connected to the drain of an amorphous silicon control transistor. The source of said transistor is formed by a column electrode and the gate is controlled by a row electrode. If so required, the second terminal of the photodiode which is common to all the diodes can be at a nonzero potential in order to reverse-bias the diode.

The present invention benefits by the progress achieved both in the field of photovoltaic diodes and in the recent performances obtained in the fabrication of control transistors for addressing liquid-crystal display screens of the flat panel type.

One of the principal advantages of the method in accordance with the invention lies in the fact that it requires only three masking levels. Furthermore, it permits the construction of large-area detectors of much greater size than those in current use.

By way of example, one advantageous application of said detector could be the construction of a two-dimensional x-ray detector on condition that a scintillator which absorbs x-rays and re-emits visible rays is interposed between the x-ray source and the detector. This would be one way to replace the photosensitive plates or the x-ray image intensifiers at present employed in radiology.

SUMMARY OF THE INVENTION

The present invention therefore relates to a method of fabrication of a light image detector and is distinguished by the fact that said method comprises the following successive steps:

(a) a first step of deposition of a first layer of conductive material on a substrate;

(b) a second step of deposition of a layer of amorphous semiconductor material doped with a predetermined first type;

(c) a third step of deposition of a layer of undoped amorphous semiconductor material;

(d) a fourth step of deposition of a layer of amorphous semiconductor material doped with a second type opposite to that of a first type of the second step;

(e) a fifth step of deposition of a first layer of metallic material;

(f) a sixth step of etching through a mask in the different layers previously deposited from the second step of deposition of photodiodes;

(g) a seventh step of deposition of a first layer of insulating material having a thickness equal to that of the photodiodes;

(h) an eighth step of machining of the insulating material located above the photodiodes in order to retain the insulating material located between said photodiodes;

(i) a ninth step of deposition of a second layer of metallic material;

(j) a tenth step of deposition of a layer of n-type doped semiconductor material;

(k) an eleventh step of etching through a mask in the layer of semiconductor material deposited during the ninth step and in the second layer of metallic material so as to form connection elements each in contact with one photodiode and columns located on the insulating medium in proximity to said connection elements;

(l) a twelfth step of deposition of a layer of undoped amorphous semiconductor material;

(m) a thirteenth step of deposition of a second layer of insulating material;

(n) a fourteenth step of deposition of a second layer of metallic material;

(o) a fifteenth step of etching through a mask in the layers of semiconductor material, of insulating material and of metallic material deposited during the twelfth, thirteenth and fourteenth steps so as to form rows which overlap said connection elements and said columns.

The invention accordingly relates to a two-dimensional matrix detector which essentially comprises:

on a substrate covered with a first layer of conductive material, a matrix of photodiodes in the form of pads arranged in rows and columns and each comprising a layer of amorphous semiconductor material doped with a predetermined type, a layer of undoped amorphous semiconductor material, a layer of doped amorphous semiconductor material doped with another predetermined type, a second layer of conductive material, each photodiode being insulated from adjacent photodiodes by means of insulating material;

on the insulating material, columns deposited along the columns of photodiodes and each formed by a layer of metallic material and a layer of doped amorphous semiconductor material;

connection elements each connected to a photodiode through the layer of conductive material of the photodiode, located in proximity to a column and each formed by a layer of metallic material and a layer of doped amorphous semiconductor material;

rows disposed along the rows of photodiodes and overlapping the columns as well as at least one connection element at each point of intersection of a row and a column, each row being formed by a layer of undoped amorphous semiconductor material, an insulating layer and a layer of metallic material.

BRIEF DESCRIPTION OF THE DRAWINGS

These and other features of the invention will be more apparent upon consideration of the following description and accompanying drawings, wherein:

FIGS. 1 to 4 show the method of fabrication of a photodiode E in accordance with the invention;

FIGS. 5 to 7 show the method of fabrication of a control transistor for the detector in accordance with the invention;

FIG. 8 is a view in perspective showing a photodiode in accordance with the invention;

FIG. 9 is a view in perspective showing a photodiode E, a connection element CX and a column CL;

FIG. 10 is a view in perspective showing a detector in accordance with the invention;

FIGS. 11 and 12 are top views showing matrix arrangements of a detector in accordance with the invention.

DETAILED DESCRIPTION OF THE INVENTION

In accordance with the invention, the method of fabrication of light image detectors provides for depositing a layer of conductive material 2 on a substrate 1 such as glass during a first step. Depending on the mode of utilization considered, said layer of conductive material can be a detector of transparent material as will be explained in the following description. There is thus deposited a thin film of mixed oxide of tin and indium (ITO) or an equivalent material (In$_2$O$_3$, SnO$_2$). A layer of this type will have a thickness of 500 to 1500 Angströms (1250 Angströms, for example) and oxidation of the layer is then performed.

During a second step, a layer 3 of p-doped amorphous silicon is deposited by means of a known method of deposition of amorphous silicon such as luminescent discharge or reactive sputtering.

In a third step, a layer 4 of undoped amorphous silicon is deposited by a method which is identical to the method of the preceding step.

In a fourth step, a layer 5 of n-doped amorphous silicon is deposited in the same manner as before.

In a fifth step, a thin metal layer 6 such as aluminum is deposited by vacuum evaporation or vacuum sputtering.

A structure as shown in FIG. 1 is thus obtained. The thickness of the four layers (silicon and metal layers) 3, 4, 5 and 6 is approximately 1 micron.

In a sixth step, photodiodes such as the photodiode E shown in FIG. 2 are cut by etching in these four layers. This etch cutting step may be performed by photolithography. This process entails the need for masking which does not require a high degree of accuracy either in dimensions or positioning. The masking operation is followed by dry etching or chemical etching of the four layers 3, 4, 5 and 6.

As shown in FIG. 2, a pin-type photodiode E is thus obtained. However, the silicon layer 3 could have been n-type doped and the silicon layer 5 could have been p-type doped, in which case a nip-type photodiode would have been obtained.

In the course of a seventh step, there is deposited an insulating layer 7, the thickness of which is equal to the thickness of the photodiode E. The insulator employed in this step can be silica or a silicon nitride. The deposition technique employed can be a luminescent discharge or reactive sputtering at a temperature which is compatible with the nature of the photodiode E. There is thus obtained a structure of the type shown in FIG. 3.

An eighth step then consists in carrying out removal of the insulating material 7 located at the surface of the metal layer 6 of the photodiode E. To this end, the surface of the insulator 7 is covered with a layer of a negative resin. The complete structure is then exposed through the substrate 1 to a source of illumination as represented by the arrows in FIG. 3. The metal layer 6 of the photodiode E serves as a mask for the insulator 7 located above the photodiode E, this insulator being subsequently removed after development. The structure thus obtained is illustrated in FIG. 4. As shown in the perspective view of FIG. 8, the top surface of the electrode E is flush with the top surface of the insulator 7.

A ninth step involves deposition of a layer 8 of metal such as chromium, palladium or molybdenum in accordance with the process adopted for deposition of the metal layer 6, that is to say by vacuum evaporation or cathode sputtering. The layer 8 must have a thickness of a few hundred Ångströms (600 Ångströms, for example).

In a tenth step, a heavily doped n-type layer of semiconductor material 9 such as amorphous silicon is deposited by means of a known method of deposition of amorphous silicon such as luminescent discharge or reactive sputtering. The thickness of this layer will be approximately 400 Ångströms (between 300 and 1500 Ångströms). A structure as shown in FIG. 5 is thus obtained.

During an eleventh step, etching of the two previously deposited layers (metal layer 8 and amorphous silicon layer 9) is carried out in such a manner as to form connection elements CX and column elements CL as shown in FIG. 6. The connection element CX is constituted by a layer 8X and a layer 9X which are etched in the layers 8 and 9 of FIG. 5. Similarly, the column CL is constituted by a layer 8L and by a layer 9L which are etched in the layers 8 and 9.

FIG. 9 gives a perspective view of the structure thus obtained. The connection element CX has the general shape of an L. One of the arms of the L is in contact with the electrode E. The other arm of the L is parallel to the column CL.

This etching step is carried out by photolithography and alone serves to define the geometry of the transistor (length of the transistor channel).

In a twelfth step, a layer 10 of semiconductor material such as undoped amorphous silicon is carried out by means of a known method such as luminescent discharge. The thickness of the layer thus obtained is approximately 3000 Ångströms.

A thirteenth step provides for deposition of an insulating layer 11 (gate insulator) by means of a method which is similar to that of the twelfth step. The thickness of the insulating layer 11 is approximately 1500 Ångströms. By way of example, the insulator employed can be a nitride.

A fourteenth step consists in depositing a layer 12 of metallic material such as chromium, palladium, molybdenum, and so on. The method of deposition of this layer will be similar to that of the ninth step of deposition of the layer 8. The thickness of the layer 12 will be approximately 300 Ångströms. On completion of the twelfth, thirteenth and fourteenth steps, a structure as shown in FIG. 7 is obtained.

In a fifteenth step, it is necessary to etch the metal layer 12, the insulating layer 11, the silicon layer 10 in order to obtain rows LG.

In the perspective view of FIG. 10, there is thus shown a row LG which is perpendicular to the column CL as well as a portion of the connection element CX. This etching operation is performed by photolithography.

At this stage, the integrated matrix image detector is formed as illustrated in FIG. 11. The substrate 1 carries rows LG, columns CL, connection elements CX at each point of intersection of a row and a column, as well as a photodiode E connected to each connection element CX.

Moreover, as shown in FIG. 12, each row LG has a portion of increased width at the level of each crossover point (transistor). This makes it possible to reduce the parasitic transistor effect which is liable to exist between the drain of the principal transistor and the following column.

It should be added that the depositions of amorphous silicon layers 10 and insulating material 11 performed during the twelfth and thirteenth steps described in the foregoing are carried out through a mask for protecting the periphery of the substrate 1 from these deposits. Thus the peripheral contacts of each row LG are formed directly on the substrate by the deposited metal layer 12.

It is also worthy of note that the deposition operation of the twelfth step can be an electrically compensated semiconductor or even a lightly p-doped semiconductor in order to reduce the photoconductivity and thus to limit the influence of light on the characteristics of the transistors.

The electric connections to the rows and columns are not shown in the accompanying figures and are established in accordance with a known technique.

A matrix detector as described in the foregoing permits detection of a light image. Since the substrate 1 and the layer 2 are transparent to the light beam which is produced by the image to be detected, this light beam illuminates a photodiode E through the substrate 1 and the layer 2, thus initiating conduction of said photodiode. Scanning of the matrix detector in rows and columns makes it possible to detect the luminous flux received by each photodiode E and to read the received image which is broken-down point by point (or electrode E).

Under these conditions, the received light image passes through the substrate 1. Should it be desired to prevent the light image from passing through said substrate in order to prevent any deformation, arrangements may accordingly be made to ensure that the metal layer 6 of the photodiode 4 is a layer of conductive material which is transparent to the luminous flux. Deposition of this material in the fifth step mentioned above is accordingly carried out by vacuum cathode sputtering and the material employed can be ITO or $SnO_2$. In this type of construction, the layer 2 may be opaque to the transmitted luminous flux.

The light image therefore arrives on the top of the formed component through the layer 6 of transparent conductive material onto the electrodes E. The image is thus formed directly on the photodiodes. Furthermore, the metal layer 12 of each row LG serves to screen the transistors at the points of intersection of the rows and columns from the incident light.

The invention will find a particularly advantageous application in radiography systems. Thus a received radiographic image may be recorded electrically in a memory. The types of material employed for the fabrication of layers which may or may not be transparent (substrate 1, layer 2, metal layer 6) must therefore be adapted to the nature of the radiations emitted by the image to be detected according to the type of application.

What is claimed is:

1. A method of fabrication of a detector for a light image which produces a light beam, comprising the following successive steps:
    (a) a first step of depositon of a first layer of conductive material on a substrate;
    (b) a second step of deposition of a layer of amorphous semiconductor material doped with a predetermined first type (p-type or n-type) on said first layer of conductive material;
    (c) a third step of deposition of a layer of undoped amorphous semiconductor material on said layer of doped amorphous semiconductor material;
    (d) a fourth step of deposition of a layer of amorhous semiconductor material doped with a second type (n-type or p-type) opposite to that of the first type of the second step on said layer of undoped amorphous semiconductor material;

(e) a fifth step of deposition of a first layer of metallic material on said layer of amorphous semiconductor material doped with a second type;

(f) a sixth step of etching through a mask in the different layers previously deposited from the second step of deposition of photodiodes;

(g) a seventh step of deposition of a first layer of insulating material having a thickness equal to that of the photodiodes on the structure remaining after said sixth step;

(h) an eighth step of machining of the insulating material located above the photodiodes in order to retain the insulating material located between said photodiodes;

(i) a ninth step of deposition of a second layer of metallic material on the structure remaining after the eighth step;

(j) a tenth step of deposition of a layer of n-type doped semiconductor material on said second layer of metallic material;

(k) an eleventh step of etching through a mask in the layer of semiconductor material deposited during the ninth step and in the second layer of metallic material so as to form connection elements each in contact with one photodiode and column located on the insulating material in proximity to said connection elements;

(l) a twelfth step of deposition of a layer of undoped amorphous semiconductor material on the structure remaining after the eleventh step;

(m) a thirteenth step of deposition of a second layer of insulating material on said layer of undoped amorphous semiconductor material of the twelfth step;

(n) a fourteenth step of deposition of a second layer of metallic material on said second layer of insulating material;

(o) a fifteenth step of etching through a mask in the layers of semiconductor material, of insulating material and of metallic material deposited during the twelfth, thirteenth and fourteenth steps so as to form rows which overlap said connection elements and columns.

2. A method according to claim 1, wherein a first layer of conductive material deposited during the first step is transparent to the light beam produced by the light image and wherein the first layer of metallic material deposited during the fifth step is opaque to said light beam.

3. A method according to claim 1, wherein the first layer of conductive material is opaque to the light beam produced by the light image and wherein the first layer of metallic material is transparent to said light beam.

4. A method according to claim 1, wherein the first layer of conductive material and the first layer of metallic material are both transparent to the light beam produced by the light image.

5. A method according to claim 1, wherein the substrate is of material which is transparent to the light beam produced by the light image.

6. A method according to claim 1, wherein the methods of deposition of the layers of semiconductor material are glow discharges.

7. A method according to claim 1, wherein the depositions of layers of metallic material are carried out by vacuum evaporation.

8. A method according to claim 1, wherein the depositions of layers of metallic material are carried out by vacuum cathode sputtering.

9. A method according to claim 1, wherein the sixth step of etching consists of photolithography including masking of the zones corresponding to the photodiodes to be obtained followed by dry etching or chemical etching of the layers deposited during the second, third, fourth and fifth steps.

10. A method according to claim 1, wherein the seventh step is carried out by glow discharge.

11. A method according to claim 1, wherein the seventh step is carried out by reactive sputtering.

12. A method according to claim 1, wherein removal of the insulator above the photodiodes is carried out by means of a negative resin and exposure through the substrate, the layer of metallic material deposited during the fifth step being employed as a mask, the etching operation being performed by means of a dry technique.

13. A method according to claim 1, wherein the insulating material deposited during the seventh step is a photosensitive polyimide and removal of this material above the photodiodes is carried out by exposure through the substrate whilst the photodiodes serve as a mask followed by development and removal of the unexposed portions and finally by annealing of the polyimide remaining between the photodiodes at a temperature which is compatible with said photodiodes.

14. A method according to claim 1, wherein the semiconductor material of the layers deposited during the second, third, fourth, tenth and twelfth steps is amorphous silicon.

15. A method according to claim 1, wherein the layer of semiconductor material deposited during the second step is a silicon-carbon alloy.

16. A method according to claim 1, wherein the twelfth and thirteenth steps of deposition of semiconductor and insulator layers are carried out through a mask which protects the periphery of the layer of conductive material deposited during the first step in order to ensure that the metallic rows deposited during subsequent steps provide contacts which are located directly on said layer of conductive material.

17. A method according to claim 1, wherein the twelfth step is a deposition of semiconductor which is electrically compensated in order to reduce the photoconductivity of said semiconductor.

18. A method according to claim 1, wherein the twelfth step is a deposition of semiconductor which is lightly p-doped in order to reduce the photoconductivity of said semiconductor.

19. A two-dimensional matrix detector comprising:
on a substrate covered with a first layer of conductive material, a matrix of photodiodes in the form of pads arranged in rows and columns and each comprising a layer of amorphous semiconductor material doped with a predetermined type (p-type or n-type), a layer of undoped amorphous semiconductor material, a layer of amorphous semiconductor material doped with another predetermined type (n-type or p-type), a second layer of conductive material, each photodiode being insulated from adjacent photodiodes by means of insulating material;

on the insulating material, columns of material disposed along the columns of photodiodes and each formed by a layer of metallic material and a layer of doped amorphous semiconductor material;

connection elements each connected to a photodiode through the layer of conductive material of the photodiode, located in proximity to a column and each formed by a layer of metallic material and a layer of doped amorphous semiconductor material; rows of material disposed along the rows of photodiodes and overlaping the columns as well as at least one connection element at each point of intersection of a row and a column, each row being formed by a layer of undoped amorphous semiconductor material, an insulating layer and a layer of metallic material.

20. A detector according to claim 19, wherein the second layer of conductive material is transparent to the light beam produced by the light image.

21. A detector according to claim 19, wherein the first layer of conductive material is transparent to the light beam produced by the light image.

22. A detector according to claim 20, wherein the first layer of conductive material is opaque to the light beam produced by the light image.

* * * * *